(12) United States Patent
Arendt et al.

(10) Patent No.: US 6,933,065 B2
(45) Date of Patent: Aug. 23, 2005

(54) HIGH TEMPERATURE SUPERCONDUCTING THICK FILMS

(75) Inventors: Paul N. Arendt, Los Alamos, NM (US); Stephen R. Foltyn, Los Alamos, NM (US); James R. Groves, Los Alamos, NM (US); Terry G. Holesinger, Los Alamos, NM (US); Quanxi Jia, Los Alamos, NM (US)

(73) Assignee: The Regents of the University of California, Los Alamos, NM (US)

(*) Notice: Subject to any disclaimer, the term of this patent is extended or adjusted under 35 U.S.C. 154(b) by 94 days.

(21) Appl. No.: 10/387,952

(22) Filed: Sep. 25, 2003

(65) Prior Publication Data
US 2004/0028954 A1 Feb. 12, 2004

Related U.S. Application Data

(63) Continuation of application No. 09/731,534, filed on Dec. 6, 2000, now abandoned.

(51) Int. Cl.[7] .......................... B32B 19/00; B32B 9/00; H01L 39/00
(52) U.S. Cl. ...................... 428/698; 428/701; 428/702; 505/230; 505/237; 505/238
(58) Field of Search ................................. 505/100, 230, 505/236, 237, 238, 239, 813, 812; 428/697, 698, 699, 701, 702, 930

(56) References Cited

U.S. PATENT DOCUMENTS

| | | | | |
|---|---|---|---|---|
| 5,135,906 A | * | 8/1992 | Harada et al. | 505/237 |
| 5,252,551 A | * | 10/1993 | Wu et al. | 505/220 |
| 5,262,394 A | * | 11/1993 | Wu et al. | 505/237 |
| 5,278,138 A | * | 1/1994 | Ott et al. | 505/446 |
| 5,432,151 A | * | 7/1995 | Russo et al. | 505/474 |
| 5,545,611 A | * | 8/1996 | Nakamura | 505/238 |
| 5,650,378 A | * | 7/1997 | Iijima et al. | 505/473 |
| 5,718,976 A | * | 2/1998 | Dorfman et al. | 428/408 |
| 5,872,080 A | * | 2/1999 | Arendt et al. | 505/238 |
| 6,055,446 A | * | 4/2000 | Kroeger et al. | 505/230 |
| 6,060,433 A | * | 5/2000 | Li et al. | 505/473 |
| 6,251,834 B1 | * | 6/2001 | Glowacki et al. | 505/239 |
| 6,251,835 B1 | * | 6/2001 | Chu et al. | 505/411 |
| 6,341,739 B1 | * | 1/2002 | Hogg | 241/24.1 |
| 6,716,545 B1 | * | 4/2004 | Holesinger et al. | 428/701 |
| 6,756,139 B2 | * | 6/2004 | Jia et al. | 428/701 |
| 6,800,591 B2 | * | 10/2004 | Jia et al. | 505/237 |

* cited by examiner

Primary Examiner—Colleen P. Cooke
(74) Attorney, Agent, or Firm—Bruce H. Cottrell

(57) ABSTRACT

An article including a substrate, a layer of an inert oxide material upon the surface of the substrate, (generally the inert oxide material layer has a smooth surface, i.e., a RMS roughness of less than about 2 nm), a layer of an amorphous oxide or oxynitride material upon the inert oxide material layer, a layer of an oriented cubic oxide material having a rock-salt-like structure upon the amorphous oxide material layer is provided together with additional layers such as at least one layer of a buffer material upon the oriented cubic oxide material layer or a HTS top-layer of YBCO directly upon the oriented cubic oxide material layer. With a HTS top-layer of YBCO upon at least one layer of a buffer material in such an article, $J_c$'s of $1.4 \times 10^6$ A/cm$^2$ have been demonstrated with projected $I_c$'s of 210 Amperes across a sample 1 cm wide.

27 Claims, 1 Drawing Sheet

| | |
|---|---|
| YBCO | 24 |
| CeO$_2$ | 22 |
| YSZ | 20 |
| Homoepitaxial MgO | 18 |
| IBAD MgO | 16 |
| Y$_2$O$_3$ | 14 |
| Al$_2$O$_3$ | 12 |
| Ni alloy substrate | 10 |

FIG. 1

| | |
|---|---|
| YBCO | 24 |
| CeO$_2$ | 22 |
| YSZ | 20 |
| Homoepitaxial MgO | 18 |
| IBAD MgO | 16 |
| Y$_2$O$_3$ | 14 |
| Al$_2$O$_3$ | 12 |
| Ni alloy substrate | 10 |

HIGH TEMPERATURE SUPERCONDUCTING THICK FILMS

This application is a continuation of Ser. No. 09/731,534, filed Dec. 6, 2000 abandoned by Arendt et al.

FIELD OF THE INVENTION

The present invention relates to high temperature superconducting thick films on polycrystalline substrates with high $J_c$'s and $I_c$'s and to structural template articles for subsequent deposition of an oriented film, e.g., of superconducting thick films. This invention is the result of a contract with the United States Department of Energy (Contract No. W-7405-ENG-36). The government has certain rights to this invention.

BACKGROUND OF THE INVENTION

One process in the production of coated conductors (superconductive tapes or films) has been referred to as a thick film process where the thickness of the superconductive layer is generally at least one micron in thickness. In the thick film process, it has been shown that YBCO thin films on single crystal substrates can achieve critical current density ($J_c$) values of over $10^6$ amperes per square centimeter ($A/cm^2$) at 77 K. The use of polycrystalline substrates other than single crystals was desired. For amorphous or polycrystalline substrates, the use of a suitable buffer layer to provide the necessary structural template was developed. For example, a YSZ buffer layer has been deposited by use of ion beam assisted deposition (IBAD) in which a YSZ layer is deposited in combination with irradiation from an ion beam directly on a substrate during the deposition. For example, both Iijima et al., U.S. Pat. No. 5,650,378 and Russo et al., U.S. Pat. No. 5,432,151 have demonstrated deposition of in-plane textured YSZ buffer layers with IBAD, leading to YBCO thin films having excellent superconducting properties. Arendt et al., U.S. Pat. No. 5,872,080 described a coated conductor having the structure YBCO/$Y_2O_3$/YSZ/$Al_2O_3$/Ni alloy with a high critical current density ($J_c$) of about $1\times10^6$ $A/cm^2$ and a high transport critical current ($I_c$) of from about 100 to about 200 A/cm. The in-plane textured YSZ of Arendt et al. was more highly aligned than that obtained by either Iijima or Russo. While the current was satisfactory, the deposition of the YSZ layer was considered too slow for commercial production.

In WO 99/25908, thin films of a material having a rock salt-like structure were deposited by IBAD upon amorphous substrate surfaces. Among the materials with a rock salt-like structure was magnesium oxide (MgO). In comparison to the deposition of YSZ, MgO can be rapidly deposited (about 100 times faster) through an IBAD process. The structures of WO 99/25908 included, e.g., YBCO/$Y_2O_3$/YSZ/MgO/MgO(IBAD)/$Si_3N_4$/Ni alloy with a NiO layer in between the YSZ layer and the MgO layer in most instances. Despite the improvement in processing speeds, the structures of WO 99/25908 had $I_c$'s of only about 50 to about 75 A/cm. In addition, at the elevated processing temperatures needed to form the superconductive layer, the silicon nitride layer reacts with other materials in the system.

Thus, further improvements in the structure and resultant properties of coated conductors have been desired. After extensive and careful investigation, improvements have been found in the preparation of superconducting films on polycrystalline substrates such as flexible polycrystalline metal substrates.

It is an object of the present invention to provide superconducting films, especially YBCO superconducting films, on polycrystalline substrates such resultant articles demonstrating properties such as high $J_c$'s and $I_c$'s.

It is another object of the present invention to provide structural template articles for subsequent deposition of oriented films, e.g., superconducting films, especially YBCO superconducting films.

SUMMARY OF THE INVENTION

To achieve the foregoing and other objects, and in accordance with the purposes of the present invention, as embodied and broadly described herein, the present invention provides an article including a substrate, a layer of an inert oxide material upon the surface of the substrate, a layer of an amorphous oxide or oxynitride material upon the inert oxide material layer, and a layer of an oriented cubic oxide material having a rock-salt-like structure upon the amorphous oxide or oxynitride material layer. In a preferred embodiment, the article is a superconductive article and further includes at least one layer of a buffer material upon the oriented cubic oxide material and a top-layer of a HTS material upon the buffer material layer.

In another embodiment of the invention, the article further includes a homo-epitaxial layer of the oriented cubic oxide material having a rock-salt-like structure between an initially deposited oriented cubic oxide material layer and a first buffer material layer.

In another embodiment of the invention, the present invention provides an article including a substrate, a layer of an amorphous oxide or oxynitride material upon the substrate, and a layer of an oriented cubic oxide material having a rock-salt-like structure upon the amorphous oxide or oxynitride material layer. In another preferred embodiment, the article is a superconductive article and further includes at least one layer of buffer material upon the oriented cubic oxide material layer and a top-layer of a HTS material upon the buffer material layer.

The present invention also provides a thin film template structure including a flexible polycrystalline metal substrate, a layer of an inert oxide material upon the surface of the flexible polycrystalline metal substrate, a layer of an amorphous oxide or oxynitride material upon the inert oxide material layer, and, a layer of an oriented cubic oxide material having a rock-salt-like structure upon the amorphous oxide or oxynitride material layer. In alternative embodiments, additional layers, e.g., buffer layers can be added onto the layer of an oriented cubic oxide material. Such thin film template structures of the present invention are useful for subsequent epitaxial thin film deposition.

The present invention also provides a thin film template structure including a flexible polycrystalline metal substrate, a layer of an inert oxide material upon the surface of the flexible polycrystalline metal substrate, and a layer of an amorphous oxide or oxynitride material upon the inert oxide material layer. Such thin film template structures of the present invention are useful for subsequent inclined substrate deposition.

BRIEF DESCRIPTION OF THE DRAWINGS

FIG. 1 shows an illustrative structure of a superconductive article in accordance with the present invention.

DETAILED DESCRIPTION

The present invention is concerned with high temperature superconducting wire or tape and the use of high temperature superconducting thick films to form such wire or tape.

The present invention is further concerned with the preparation of structural template articles for the subsequent deposition of oriented films, e.g., superconducting thick films or other materials where orientation is desirable.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium as is well known, may also be used. Other superconducting materials such as bismuth and thallium based superconductor materials may also be employed. $YBa_2Cu_3O_{7-\delta}$ is preferred as the superconducting material.

In the present invention, the initial or base substrate can be, e.g., any polycrystalline material such as a metal or a ceramic such as polycrystalline aluminum oxide or polycrystalline yttria-stabilized zirconia (YSZ). Preferably, the substrate can be a polycrystalline metal such as nickel. Alloys including nickel such as various Hastelloy metals, Haynes metals and Inconel metals are also useful as the substrate. The metal substrate on which the superconducting material is eventually deposited should preferably allow for the resultant article to be flexible whereby superconducting articles (e.g., coils, motors or magnets) can be shaped. As such a metal substrate can have a rough surface, it can be mechanically polished, electrochemically polished or chemically mechanically polished to provide a smoother surface. Alternatively, the desired smoothness for subsequent depositions can be provided by the first coating layer, i.e., an inert oxide material layer.

Whether the metal substrate is polished or not, a layer of an inert oxide material can be deposited upon the base substrate. By "inert" is meant that this oxide material does not react with the base substrate or with any subsequently deposited materials. Examples of suitable inert oxide materials include aluminum oxide ($Al_2O_3$), erbium oxide ($Er_2O_3$), yttrium oxide ($Y_2O_3$), and yttria-stabilized zirconia (YSZ). The inert oxide layer can be deposited on the base substrate by pulsed laser deposition, e-beam evaporation, sputtering or by any other suitable means. The layer is deposited at temperatures of generally greater than about 400° C. When the base substrate is metallic, it often has a rough surface with, e.g., a RMS of 15 nm to 100 nm or greater. Generally, the inert oxide layer has a thickness of from about 100 nanometers (nm) to about 1000 nm depending upon the roughness of the base substrate with a thicker coating layer for rougher base substrate surfaces. The inert oxide layer serves to provide a smooth surface for subsequent depositions. By "smooth" is meant a surface having a root mean square (RMS) roughness of less than about 2 nm, preferably less than about 1 nm. To obtain the desired smoothness, it can be preferred to treat the deposited inert oxide layer by chemical mechanical polishing. In the case of erbium oxide, the inert oxide material can also serve as a nucleation layer for subsequent layers.

Alternatively, when using aluminum-containing metal substrates a layer of aluminum oxide can be directly formed in situ. Using aluminum-containing metal substrates with less than about 30 atomic percent aluminum has generally required a heat treatment of the metal substrate to form the aluminum oxide layer, while with aluminum-containing metal substrates containing greater than about 30 atomic percent aluminum, an intermediate aluminum oxide layer is achieved without any required heat treatment other than that achieved during normal deposition processing. Heat treatment of the aluminum-containing metal substrate generally involves heating at from about 800° C. to about 1000° C. in an oxygen atmosphere.

Substrates are prepared for subsequent IBAD MgO overcoatings by the following. If the as received metal alloy starts out with a RMS roughness of less than about 15 nm, the metal substrate can be chemically mechanically polished (CMP) to a RMS roughness of about 1.5 nm. (Note: For measuring roughness, all scans are done using scanning force microscopy and are over a 5×5 μm area.) The time needed to do this is approximately 2 minutes. The polishing slurry used is commercially available colloidal silica (e.g., Mastermet 2, 0.02 μm non-crystallizing colloidal silica suspension, available from Buehler, Ltd., Lake Bluff, Ill.). If the initial metal substrate is much rougher (e.g., a RMS roughness of greater than about 15 nm), then the metal substrate is generally mechanically polished with a 1 micron diamond paste for a short time period of from about 10 seconds to about 20 seconds to get the finish to about 4 nm to about 6 nm followed by a 2 minute CMP with silica as previously described. Preferably, the metal substrate starts out with a minimum of inclusions (less than about 5 inclusions per 5×5 μm area). Inclusions are usually harder than the surrounding metal matrix and generally appear as bumps or holes (where the polishing plucks them out of the metal matrix) in surface profile scans.

In one embodiment of the present invention, a layer of an amorphous oxide or oxynitride material is next deposited upon the inert oxide material layer. The amorphous oxide or oxynitride layer can serve as a nucleation layer for oriented growth of subsequent layers. The amorphous oxide or oxynitride layer can be deposited on the base substrate by pulsed laser deposition, e-beam evaporation, sputtering or by any other suitable means. The layer is generally deposited at temperatures of generally about 100° C. The amorphous oxide or oxynitride layer is typically from about 5 nm to about 100 nm in thickness, preferably from about 20 nm to about 40 nm. Among the oxide or oxynitride materials suitable as the amorphous layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate ($NiAl_2O_4$), and barium zirconate ($BaZrO_3$). Preferably, the layer of oxide or oxynitride amorphous material is yttrium oxide, aluminum oxynitride, erbium oxide or yttria-stabilized zirconia and more preferably is yttrium oxide or erbium oxide. For the very best surface finishes with a RMS roughness of less than about 1 nm, after the smooth or polished metal alloy is overcoated with the inert oxide film, a short (e.g., about 5 seconds) CMP step can be conducted.

In another embodiment of the invention, a single layer of erbium oxide is used to provide both the smoothness and the nucleation layer. Such a layer can be chemically mechanically polished if desired.

This intermediate article provides an excellent substrate for the subsequent deposition of a layer of an oriented cubic oxide material having a rock-salt-like structure. Such oriented cubic oxide materials can be, e.g., magnesium oxide, calcium oxide, strontium oxide, zirconium oxide, barium oxide, europium oxide, samarium oxide and other materials such as described in WO 99/25908 by Do et al. Preferably, the layer of oriented cubic oxide material having a rock-salt-like structure is a magnesium oxide (MgO) layer. Such a MgO layer is preferably deposited by electron beam evaporation with an ion beam assist. The MgO layer in the ion beam assisted deposition is typically evaporated from a crucible of magnesia. An ion-assisted, electron-beam evaporation system similar to that described by Wang et al., App.

Phys. Lett., vol. 71, no. 20, pp. 2955–2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°.

The ion source gas in the ion beam assisted deposition is argon. The ion beam assisted deposition of MgO is conducted with substrate temperatures of generally from about 20° C. to about 100° C. The MgO layer deposited by the IBAD process is generally from about 5 nm to about 20 nm in thickness, preferably about 8 nm to about 15 nm. After deposition of the oriented cubic oxide material having a rock-salt-like structure, e.g., MgO, an additional thin homo-epitaxial layer of the MgO can be optionally deposited by a process such as electron beam or magnetron sputter deposition. This thin layer can generally be about 100 nm in thickness. Deposition of the homo-epitaxial layer by such a process can be more readily accomplished than depositing the entire thickness by ion beam assisted deposition.

A thin film template structure is also provided in accordance with the present invention and includes a substrate (e.g., a polycrystalline flexible metal substrate), a layer of an inert oxide material upon the surface of the substrate, said inert oxide material layer preferably having a smooth surface (RMS roughness of less than 2 nm, preferably less than about 1 nm), a layer of an amorphous oxide or oxynitride material upon the inert oxide material layer, and, a layer of an oriented cubic oxide material having a rock-salt-like structure upon the amorphous oxide or oxynitride material layer. Such a thin film template structure is useful for subsequent deposition of epitaxial thin films. Such epitaxial thin films can be formed from a material selected from the group consisting of superconductors, including high temperature superconductors, semiconductors, photovoltaic materials, magnetic materials, and precursors of superconductors or high temperature superconductors. The thin film template structure is especially preferred for subsequent deposition of high temperature superconductor materials. Depending upon the particular epitaxial thin film material deposited upon the thin film template structure, additional layers such as buffer layers can be employed for enhanced chemical or structural compatibility. In the case of YBCO as a high temperature superconductor, buffer layers are generally employed although they are not required.

Another thin film template structure is also provided in accordance with the present invention and includes a substrate (e.g., a polycrystalline flexible metal substrate), a layer of an inert oxide material upon the surface of the substrate, said inert oxide material layer preferably having a smooth surface (RMS roughness of less than 2 nm, preferably less than about 1 nm), and a layer of an amorphous oxide or oxynitride material upon the inert oxide material layer. Such a thin film template structure is useful as a highly smooth surface for subsequent inclined substrate deposition of thin films.

In one embodiment of the present invention, one or more intermediate layers are deposited onto the MgO layer so that they are between the MgO layer deposited by the IBAD process and the superconducting YBCO layer. The one or more intermediate layers serve as buffer layers between the MgO layer and the YBCO and assists in lattice matching. This so-called "buffer layer" should have good "structural compatibility" between the MgO or other oriented cubic oxide material deposited in the IBAD process and the YBCO and should have good chemical compatibility with both adjacent layers. By "chemical compatibility" is meant that the intermediate layer does not undergo property-degrading chemical interactions with the adjacent layers. By "structural compatibility" is meant that the intermediate layer has a substantially similar lattice structure with the superconductive material. Among the materials suitable as one or more intermediate buffer layers are cerium oxide, yttria-stabilized zirconia, strontium titanate, yttrium oxide, europium copper oxide ($Eu_2CuO_4$), neodymium copper oxide ($Nd_2CuO_4$), yttrium copper oxide ($Y_2CuO_4$), and other rare earth copper oxides ($RE_2CuO_4$) or rare earth oxides and other cubic oxide materials such as those described in U.S. Pat. No. 5,262,394, by Wu et al. for "Superconductive Articles Including Cerium Oxide Layer" such description hereby incorporated by reference. In a preferred embodiment, the present invention includes a layer of yttria-stabilized zirconia or strontium titanate on the MgO layer and a top-layer of yttrium oxide or cerium oxide for the layer of yttria-stabilized zirconia. The layer of yttria-stabilized zirconia or strontium titanate is generally from about 50 nm to about 1000 nm in thickness, preferably from about 100 nm to about 500 nm in thickness. The layer of cerium oxide, yttrium oxide or strontium titanate is generally from about 5 nm to about 200 nm in thickness, preferably from about 5 nm to about 20 nm in thickness.

The intermediate or buffer layers are generally deposited at temperatures of greater than about 700° C., preferably at temperatures of from about 700° C. to about 950° C.

A high temperature superconducting (HTS) layer, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating. The substrate can be heated during deposition at temperatures from about 600° C. to about 950° C., preferably from about 700° C. to about 850° C. An oxygen atmosphere of from about 0.1 millitorr (mTorr) to about 500 mTorr, preferably from about 100 mTorr to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter (J/cm$^2$). After deposition, the films generally are cooled within an oxygen atmosphere of greater than about 100 Torr to room temperature.

In one embodiment of the present invention illustrated in FIG. 1, a nickel alloy substrate 10 is initially coated with a layer of aluminum oxide 12 from about 80 nm to 100 nm in thickness deposited by pulsed laser deposition. The aluminum oxide layer is polished by chemical mechanical polishing to a smoothness of about 1 nm. Then, a layer 14 of $Y_2O_3$ of from about 5 nm to about 100 nm in thickness is deposited on the aluminum oxide by pulsed laser deposition. Then, a layer 16 of MgO (about 10 nm) is deposited on the yttrium oxide by ion beam assisted deposition. Then, a homoepitaxial layer 18 of MgO is deposited upon the IBAD-MgO layer, the homoepitaxial layer of MgO of about 100 nm in thickness deposited in a process such as electron beam or magnetron sputter deposition. Next, a first buffer layer 20 of YSZ of from about 50 nm to about 1000 nm in thickness is deposited on the MgO layer. Then a second buffer layer 22 of cerium oxide of from about 5 nm to about 40 nm in thickness is deposited on the YSZ layer. Finally, a layer 24 of YBCO is deposited, e.g., by pulsed laser deposition at a thickness of, e.g., about 1000 nm to 2000 nm.

The present invention is more particularly described in the following examples which are intended as illustrative only, since numerous modifications and variations will be apparent to those skilled in the art.

EXAMPLE 1

An ion-assisted, electron beam evaporation system similar to that of Wang et al., App. Phys. Lett., v. 71, no. 20, pp. 2955–2957 (1997), was used to deposit a MgO film upon a flexible metal substrate of Hastelloy C-276 or other nickel-based alloys. The substrates were ultrasonically cleaned in soap and water, rinsed with deionized water, rinsed with methanol and blown dry with filtered nitrogen. The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr. The electron gun heated the MgO source to maintain a deposition rate of about 0.15 nm/sec. The ion-assist gun voltage and current density were about 750 eV and 100 $\mu$A/cm$^2$ respectively.

Various amorphous oxide materials were used and x-ray phi scan measurements were taken. The results of the x-ray phi scan measurements on the final YBCO layer on the various materials are shown (full-width-half maxima) in Table 1.

TABLE 1

| Amorphous oxide layer | φ-scan FWHM of YBCO | Buffer layer(s) | YBCO (μm) | $J_c$ (MA/cm$^2$) | $I_c$ (A/cm-width) |
|---|---|---|---|---|---|
| $Al_2O_3$ | 15.0 | $YSZ/Y_2O_3$ | 1.1 | 0.03 | 3 |
| Diamond-like C | 11.2 | $YSZ/Y_2O_3$ | — | — | — |
| $Y_2O_3$ | 5.6 | $YSZ/Y_2O_3$ | 0.9 | .05 | 5 |
| $Y_2O_3$ | 5.9 | $SrTiO_3$ | 0.9 | 0.14 | 13 |

TABLE 1-continued

| Amorphous oxide layer | φ-scan FWHM of YBCO | Buffer layer(s) | YBCO (μm) | $J_c$ (MA/cm$^2$) | $I_c$ (A/cm-width) |
|---|---|---|---|---|---|
| $Er_2O_3$ | 4.0 | $YSZ/CeO_2$ | 1.1 | 0.86 | 95 |
| YSZ (by e-beam) | 5.6 | $YSZ/CeO_2$ | 1.25 | 0.11 | 14 |
| EuO | 10.5 | $YSZ/CeO_2$ | 1.25 | 0.03 | 4 |
| $Y_2O_3$ | 4.3 | $YSZ/CeO_2$ | 1.3 | 0.54 | 70 |

EXAMPLE 2

On a nickel alloy substrate (Hastelloy C276), was deposited by magnetron sputter deposition a layer of aluminum oxide about 800 to about 1000 Angstroms in thickness. The aluminum oxide layer was then polished by CMP (chemical-mechanical-polishing) with a colloidal suspension of silica as the polishing medium. The resultant surface of the aluminum oxide had a smoothness (RMS roughness) of about 1 nm. Onto this resultant article was deposited a layer of $Y_2O_3$ (about 5 nm) by e-beam evaporation. Onto this resultant article was deposited a layer of MgO about 10 nm in thickness using ion beam assisted electron beam deposition with an ion assist gas of argon. Onto the IBAD-MgO layer was then deposited a layer of homoepitaxial MgO by e-beam evaporation. Onto the top MgO layer was deposited a layer of yttria-stabilized zirconium (YSZ) about 30 nm in thickness by pulsed laser deposition. Onto the layer of YSZ was deposited a layer of cerium oxide about 30 nm in thickness by pulsed laser deposition. Finally, a layer of YBCO about 1500 nm in thickness was then deposited on the cerium oxide by pulsed laser deposition. The $J_c$ was measured as $1.4 \times 10^6$ A/cm$^2$ using a standard four-point measurement. The projected $I_c$ is 210 Amperes across a sample 1 cm wide.

EXAMPLE 3

On a nickel alloy substrate (Haynes 242), was deposited by magnetron sputter deposition a layer of aluminum oxide about 80 nm to 100 nm in thickness. The aluminum oxide layer was then polished by CMP (chemical-mechanical polishing) with a colloidal suspension of silica as the polishing medium. The resultant surface of the aluminum oxide had a smoothness (RMS roughness) of 1 nm. Onto this resultant article was deposited a layer of AlON (about 20 nm) by magnetron sputter deposition. Onto this resultant article was deposited a layer of MgO about 10 nm in thickness using ion beam assisted electron beam deposition with an ion assist gas of argon. Onto the IBAD-MgO layer was then deposited a layer of homoepitaxial MgO by e-beam evaporation. Onto the top MgO layer was deposited a layer of yttria-stabilized zirconium (YSZ) about 30 nm in thickness by pulsed laser deposition. Onto the layer of YSZ was deposited a layer of cerium oxide about 30 nm in thickness by pulsed laser deposition. Finally, a layer of YBCO about 1150 nm in thickness was then deposited on the cerium oxide by pulsed laser deposition. The $J_c$ was measured as $0.51 \times 10^6$ A/cm$^2$ using a standard four-point measurement. The projected $I_c$ is 59 Amperes across a sample 1 cm wide.

Although the present invention has been described with reference to specific details, it is not intended that such details should be regarded as limitations upon the scope of the invention, except as and to the extent that they are included in the accompanying claims.

What is claimed is:

1. An article comprising:
   a substrate;
   a layer of an inert oxide material upon the surface of the substrate;
   an amorphous layer of aluminum oxynitride upon the inert oxide material layer; and,
   a layer of an oriented cubic oxide material having a rock-salt-like structure upon the amorphous layer.

2. The article of claim 1 wherein the inert oxide material layer is characterized as having a RMS roughness of less than about 2 nm.

3. The article of claim 1 further including at least one layer of a buffer material upon the oriented cubic oxide material layer.

4. The article of claim 1 further including a top-layer of YBCO upon the oriented cubic oxide material layer.

5. The article of claim 1 wherein the substrate is a flexible polycrystalline metal.

6. The article of claim 3 wherein the at least one layer of a buffer material includes a layer of a first buffer material upon the oriented cubic oxide material layer and a layer of a second buffer material upon the first buffer material layer.

7. The article of claim 3 further including a top-layer of YBCO upon the at least one layer of a buffer material.

8. The article of claim 6 further including a top-layer of YBCO upon the second buffer material layer.

9. The article of claim 1 wherein the layer of an oriented cubic oxide material having a rock-salt-like structure is deposited by ion beam assisted deposition.

10. The article of claim 9 further including at least one layer of a buffer material upon the oriented cubic oxide material layer.

11. The article of claim 10 further including a layer of homoepitaxial oriented cubic oxide material having a rock-salt-like structure between the ion beam assisted deposited cubic oxide material layer and the buffer material layer.

12. The article of claim 11 further including a top-layer of YBCO upon the at least one layer of a buffer material.

13. The article of claim 1 wherein the inert oxide material layer is a material selected from the group consisting of aluminum oxide, erbium oxide, and yttrium oxide.

14. The article of claim 1 wherein the oriented cubic oxide material layer is magnesium oxide.

15. The article of claim 6 wherein the first buffer material layer is yttria-stabilized zirconia.

16. The article of claim 3 wherein the at least one layer of a buffer material is strontium titanate.

17. The article of claim 6 wherein second buffer material layer is a material selected from the group consisting of cerium oxide, yttrium oxide, europium copper oxide, neodymium copper oxide, yttrium copper oxide, other rare earth oxides and other rare earth copper oxides.

18. A thin film template structure for subsequent epitaxial thin film deposition comprising:
    a polycrystalline flexible metal substrate;
    a layer of an inert oxide material upon the surface of the polycrystalline flexible metal substrate;
    an amorphous layer of aluminum oxynitride upon the inert oxide material layer; and,
    a layer of an oriented cubic oxide material having a rock-salt-like structure upon the amorphous aluminum oxynitride layer.

19. The thin film template structure of claim 18 wherein the inert oxide material layer is characterized as having a RMS roughness of less than about 2 nm.

20. The thin film template structure of claim 18 wherein the inert oxide material layer is a material selected from the group consisting of aluminum oxide, yttrium oxide, and erbium oxide.

21. The thin film template structure of claim 18 wherein the oriented cubic oxide material layer is magnesium oxide.

22. The thin film template structure of claim 18 further including a layer of a first buffer material upon the oriented cubic oxide material layer.

23. The thin film template structure of claim 19 wherein the buffer layer is a material selected from the group consisting of yttria-stablized zirconia and strontium titanate.

24. The thin film template structure of claim 19 further including a layer of a first buffer material upon the oriented cubic oxide material layer.

25. The thin film template structure of claim 24 wherein the second buffer layer is a material selected from the group consisting of cerium oxide.

26. The article of claim 1 wherein said substrate is a flexible polycrystalline metal said inert oxide material layer is aluminum oxide, said layer of oriented cubic oxide material having a rock-salt-like structure is magnesium oxide, and said article further includes a first buffer layer of yttria-stabilized zirconia upon the magnesium oxide, a second buffer layer of cerium oxide on the layer of yttria-stabilized zirconia and a layer of YBCO on the layer of cerium oxide.

27. The thin film template of claim 19 wherein said inert oxide material layer is aluminum oxide and said layer of oriented cubic oxide material having a rock-salt-like structure is magnesium oxide.

* * * * *